US008357849B2

(12) United States Patent
Peumans et al.

(10) Patent No.: US 8,357,849 B2
(45) Date of Patent: Jan. 22, 2013

(54) ORGANIC PHOTOSENSITIVE DEVICES

(75) Inventors: Peter Peumans, Palo Alto, CA (US);
Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 1918 days.

(21) Appl. No.: 10/949,375

(22) Filed: Sep. 27, 2004

(65) Prior Publication Data
US 2006/0060239 A1 Mar. 23, 2006

Related U.S. Application Data

(60) Provisional application No. 60/611,874, filed on Sep. 22, 2004.

(51) Int. Cl.
*H01L 31/00* (2006.01)
(52) U.S. Cl. ............ 136/263; 136/252; 438/82; 438/57; 438/99; 257/184; 257/183; 257/40; 257/E51.01; 257/E51.011; 257/E51.015; 257/E51.017; 257/E27.117
(58) Field of Classification Search ............ 372/96; 136/243, 263; 250/214.1; 257/300, 184, 257/183, 40, E51.01, E51.011, E51.015, 257/E51.017, E27.117; 438/82, 57, 99
See application file for complete search history.

(56) References Cited

U.S. PATENT DOCUMENTS

| | | | |
|---|---|---|---|
| 5,703,436 A | 12/1997 | Forrest et al. | 313/506 |
| 6,097,147 A | 8/2000 | Baldo et al. | 313/506 |
| 6,198,091 B1 * | 3/2001 | Forrest et al. | 250/214.1 |
| 6,333,458 B1 | 12/2001 | Forrest et al. | 136/259 |
| 6,352,777 B1 | 3/2002 | Bulovic et al. | 428/411.1 |
| 6,420,031 B1 | 7/2002 | Parthasarathy et al. | 428/411.1 |
| 6,440,769 B2 | 8/2002 | Peumans et al. | 438/65 |
| 6,451,415 B1 | 9/2002 | Forrest et al. | 428/412 |
| 6,580,027 B2 | 6/2003 | Forrest et al. | 136/263 |
| 6,657,378 B2 | 12/2003 | Forrest et al. | 313/503 |
| 2002/0090016 A1 * | 7/2002 | Coldren et al. | 372/96 |
| 2002/0189666 A1 | 12/2002 | Forrest | |
| 2003/0052334 A1 * | 3/2003 | Lee et al. | 257/200 |

OTHER PUBLICATIONS

Tang, "*Two-layer organic photovoltaic cells*," Applied Physics Letter, vol. 48, No. 2, p. 183-185 (1986).
Tang et al, "*Organic electroluminescent diodes*," Applied Physics Letter, vol. 51, No. 12, p. 913-915 (1987).

(Continued)

*Primary Examiner* — Jonathan Johnson
*Assistant Examiner* — Golam Mowla
(74) *Attorney, Agent, or Firm* — Duane Morris LLP (57) ABSTRACT

A photoactive device is provided. The device includes a first electrode, a second electrode, and a photoactive region disposed between and electrically connected to the first and second electrodes. The photoactive region further includes an organic donor layer and an organic acceptor layer that form a donor-acceptor heterojunction. The mobility of holes in the organic donor region and the mobility of electrons in the organic acceptor region are different by a factor of at least 100, and more preferably a factor of at least 1000. At least one of the mobility of holes in the organic donor region and the mobility of electrons in the organic acceptor region is greater than 0.001 $cm^2$/V-sec, and more preferably greater than 1 $cm^2$/V-sec. The heterojunction may be of various types, including a planar heterojunction, a bulk heterojunction, a mixed heterojunction, and a hybrid planar-mixed heterojunction.

9 Claims, 8 Drawing Sheets

OTHER PUBLICATIONS

Pewmans et al., "*Efficient photon harvesting at high optical intensities in ultra thin organic double-heterostructure photovoltaic diodes*," Applied Physics Letter, vol. 76, No. 19, p. 2650-2652 (2000).

Arkhipov et al, "*Why is exciton dissociation so efficient at the interface between a conjugated polymer and an electron acceptor?*" Applied Physics Letter, vol. 82, No. 25, p. 4605-4607 (2003).

Peumans et al, "*Efficient, high-bandwidth organic multilayer photodetectors*," Applied Physics Letter, vol. 76, No. 26, p. 3855-3857 (2000).

Shaheen et al., "*2.5% efficient organic plastic solar cells*," Applied Physics Letter, vol. 78, No. 6, p. 841-843 (2001).

Peumans et al., "*Very-high-efficiency double-heterostructure copper phthalocyanine/$C_{60}$ photovoltaic cells*," Applied Physics Letter, vol. 79, No. 1, p. 126-128 (2001).

Hill et al., "*Charge-separation energy in films of π-conjugated organic molecules*," Chemical Physics Letters, vol. 327, p. 181-188 (2000).

Brabec et al, "*Tracing photo induced electron transfer process in conjugated polymer/fullerene bulk heterojunctions in real time*," Chemical Physics Letters, vol. 340, p. 232-236 (2001).

Kane et al, IEEE Electron. Device Letter, vol. 21, p. 534 (2000).

Pettersson et al., "*Modeling photocurrent action spectra of photovoltaic devices based on organic thin films*," Journal of Applied Physics, vol. 86, No. 1, p. 487-496 (1999).

Peumans et al, "*Small molecular weight organic thin-film photodetectors and solar cells*," Journal of Applied Physics, vol. 93, No. 7, p. 3693-3723 (2003).

Scher et al., "*Theory of geminate recombination on a lattice*," Journal of Chemical Physics, vol. 81, No. 4, p. 1994-2008 (1984).

Van Hal et al., "*Full temporal resolution of the two-step photoinduced energy-electron transfer in a fullerene-oligothiophene-fullerene triad using sub-10 fs pump-probe spectroscopy*," Chemical Physics Letter, vol. 345, p. 33 (2001).

Onsager, "*Initial recombination of ions*," Physical Review, vol. 54, p. 554-557 (1938).

Rackovsky et al., "*Theory of geminate recombination as a molecular process*," Physical Review Letter, vol. 52, No. 6, p. 453-456 (1984).

Zerza et al., "*Ultrafast charge transfer in conjugated polymer-fullerene composites*," Synthetic Metals, vol. 119, p. 637-638 (2001).

Mihailetchi et al., "Electron transport in a methanofullerene", Adv. Funct. Mater. 13(1): 43-46, 2003.

Naka et al., "Carrier transport properties of organic materials for EL device operation", Synthetic Metals, vol. 111-112, pp. 331-333, 2000.

Kitamura et al., "Time-of-flight-measurement of lateral carrier mobility in organic thin films", Japanese Journal of Applied Physics 43(4b): 2326-2329, 2004.

Könenkamp et al., "Carrier mobilities and influence of oxygen in C60 films", Physical Review B 60(16): 11804-11808, 1999.

International Search Report dated Feb. 20, 2008, Int'l. Appln. No. PCT/US2005/033258 filed Sep. 15, 2005.

\* cited by examiner

ORGANIC PHOTOSENSITIVE DEVICES

This application claims priority to U.S. Provisional Application No. 60/611,874, filed on Sep. 22, 2004, which is incorporated by reference in its entirety.

GOVERNMENT RIGHTS

This invention was made with Government support under Contract No. F49620-96-1-0277 awarded by Air Force Office of Scientific Research. The government has certain rights in this invention.

RESEARCH AGREEMENTS

The claimed invention was made by, on behalf of, and/or in connection with one or more of the following parties to a joint university-corporation research agreement: Princeton University, The University of Southern California and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having a donor-acceptor junction.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{max}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_p$, may be calculated by:

$$\eta_p = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \rightarrow S_0^*$. Here $S_0$ and $S_0^*$ denote ground and excited molecular states, respectively. This energy absorption is associated with the promotion of an electron from a bound state in the HOMO energy level, which may be a $\pi$-bond, to the LUMO energy level, which may be a $\pi^*$-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for exciton diffusion, CC for charge collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

SUMMARY OF THE INVENTION

A photoactive device is provided. The device includes a first electrode, a second electrode, and a photoactive region disposed between and electrically connected to the first and second electrodes. The photoactive region further includes an organic donor layer and an organic acceptor layer that form a donor-acceptor heterojunction. The mobility of holes in the organic donor region and the mobility of electrons in the organic acceptor region are different by a factor of at least 100, and more preferably a factor of at least 1000. At least one of the mobility of holes in the organic donor region and the mobility of electrons in the organic acceptor region is greater than 0.001 cm$^2$/V-sec, and more preferably greater than 1 cm$^2$/V-sec. The heterojunction may be of various types, including a planar heterojunction, a bulk heterojunction, a mixed heterojunction, and a hybrid planar-mixed heterojunction.

DETAILED DESCRIPTION

An organic photosensitive optoelectronic device is provided. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Figure 1:
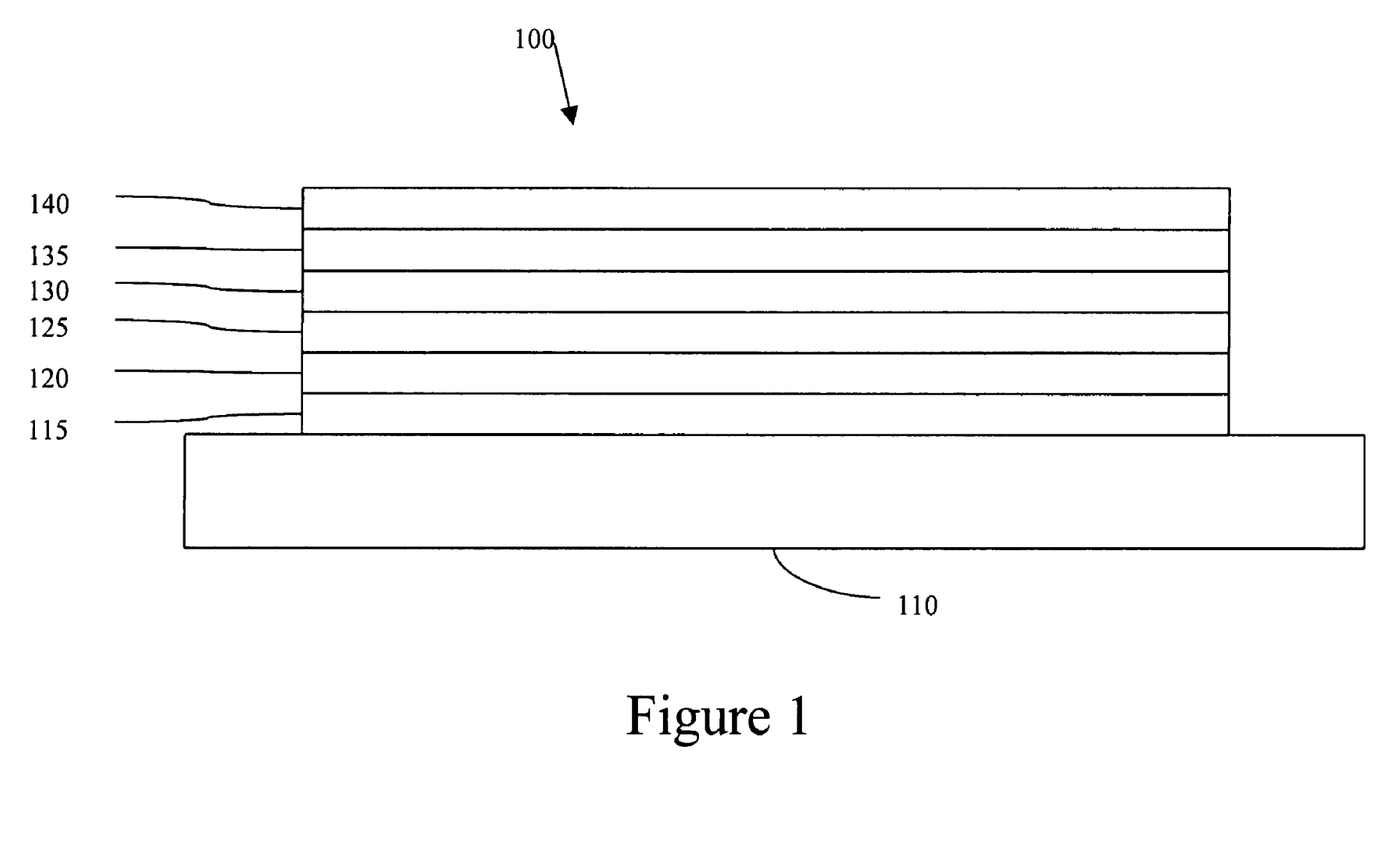
FIG. 1 shows an organic PV device comprising an anode, an anode smoothing layer, a donor layer, an acceptor layer, a blocking layer, and a cathode.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The substrate may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

U.S. Pat. No. 6,352,777, incorporated herein by reference, provides examples of electrodes, or contacts, that may be used in a photosensitive optoelectronic device. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. Pat. No. 6,420,031, to Parthasarathy et al. ("Parthasarathy '031"), or a highly efficient, low resistance metallic/non-metallic compound cathode such as disclosed in U.S. Pat. No. 5,703,436 to Forrest et al. ("Forrest '436"), both incorporated herein by reference in their entirety. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photo-conducting material, which is equivalent to electrons moving in the opposite manner. It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of a fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

Through the use of an organometallic material in the photoactive region, devices incorporating such materials may efficiently utilize triplet excitons. It is believed that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

In a preferred embodiment of the invention, the stacked organic layers include one or more exciton blocking layers (EBLs) as described in U.S. Pat. No. 6,097,147, Peumans et al, *Applied Physics Letters* 2000, 76, 2650-52, and co-pending application Ser. No. 09/449,801, filed Nov. 26, 1999, both incorporated herein by reference. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO energy level closely matching the LUMO energy level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the acceptor layer and the cathode. A preferred material for the EBL comprises 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III)phenolate(Alq$_2$OPH). BCP is an effective exciton blocker which can easily transport electrons to the cathode from an acceptor layer.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticle or nanorods as described in U.S. Pat. No. 6,657,378, incorporated herein by reference in its entirety.

In a preferred embodiment of the invention, an anode-smoothing layer is situated between the anode and the donor layer. A preferred material for this layer comprises a film of 3,4-polyethylenedioxythiophene:polystyrenesulfonate (PE-DOT:PSS). The introduction of the PEDOT:PSS layer between the anode (ITO) and the donor layer (CuPc) may lead to greatly improved fabrication yields. This is attributed to the ability of the spin-coated PEDOT:PSS film to planarize the ITO, whose rough surface could otherwise result in shorts through the thin molecular layers.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Preferred organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, spin coating, organic vapor-phase deposition, inkjet printing and other methods known in the art.

Organic photosensitive optoelectronic devices of embodiments of the present invention may function as a PV, photodetector or photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, LD, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

The organic photosensitive optoelectronic devices of the present invention may function as photodetectors. In this embodiment, the device may be a multilayer organic device, for example as described in U.S. application Ser. No. 10/723, 953, filed Nov. 26, 2003, incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. Nos. 6,333,458 and 6,440,769, incorporated herein by reference in their entirety, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333,458 and 6,440,769 therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

Coatings may be used to focus optical energy into desired regions of a device. U.S. patent application Ser. No. 10/857,747, which is incorporated by reference in its entirety, provides examples of such a coating.

Although many of the illustrations involve a planar heterojunction, embodiments of the invention may be used in connection with various types of heterojunctions, including the following: A planar heterojunction occurs when the interface between a layer of donor material and a layer of acceptor material is defined by a surface with a surface roughness not more than a few molecules. The surface area of the contact between the acceptor and donor is approximately the same as the area of the respective layers. A bulk heterojunction occurs when the interface between a layer of donor material and a layer of acceptor material has significant surface roughness, such that the surface area of the contact between the acceptor and donor is significantly greater than the cross sectional area of the respective layers. A mixed heterojunction is a type of bulk heterojunction created by co-depositing acceptor and donor material. A hybrid planar-mixed heterojunction includes at least one layer of acceptor or donor material, as well as a mixed layer, as described in further detail in U.S. patent application Ser. No. 10/911,559 to Forrest, filed Aug. 5, 2004, which is incorporated by reference in its entirety.

Surprisingly high carrier separation efficiency may be observed observed at donor-acceptor (DA) junctions found, for example, in organic DA PV cells. See C. W. Tang, Appl. Phys. Lett. 48, 183 (1986); J. J. M. Halls, C. A. Walsh, N. C. Greenham, E. A. Marseglia, R. H. Friend, S. C. Moratti, and A. B. Holmes, Nature 376, 498 (1995); G. Yu, J. Gao, J. Hummelen, F. Wudi, and A. J. Heeger, Science 270, 1789 (1995). However, the voltage dependence of the photocurrent for organic DA PV cells may limit the ultimate power efficiency attainable. This is in contrast to conventional semiconductor p-n junctions, where the photocurrent is constant up to an applied voltage considerably exceeding the built-in potential, $V_{bi}$.

Because of small electronic bandwidths and strong coupling of phonons to electronic states, optical excitations in an organic solid may rapidly relax to form an exciton that is localized on one or a few molecules with binding energies ranging from $E_B$=0.1 to 2 eV. I. G. Hill, A. Kahn, G. Soos, and R. A. Pascal, Chem. Phys. Lett. 327, 181 (2000). A free electron and hole are produced by exciton dissociation, a process that can be induced by an electric field F $10^6$ V/cm. However, in a typical organic PV cell, a built-in potential of 1 V and an active layer thickness of 1000 A result in F of about $10^5$ V/cm, leading to a low external quantum efficiency ($\eta_{EQE}$<1%, typical). $\eta_{EQE}$ and $a\eta_{EXT}$ both refer to external quantum efficiency.

At a DA interface, a donor material with a low ionization potential forms a heterojunction with an acceptor material with a high electron affinity such that exciton dissociation into free charge carriers is energetically favorable. For an exciton in the donor (acceptor) material, this condition is satisfied if the difference in the energies of the lowest unoccupied (highest occupied) molecular orbitals, $E_{LUMO}$ ($E_{HOMO}$), exceeds the donor (acceptor) exciton binding energy, $E_{B,D}$ ($E_{B,A}$).

Figure 2:
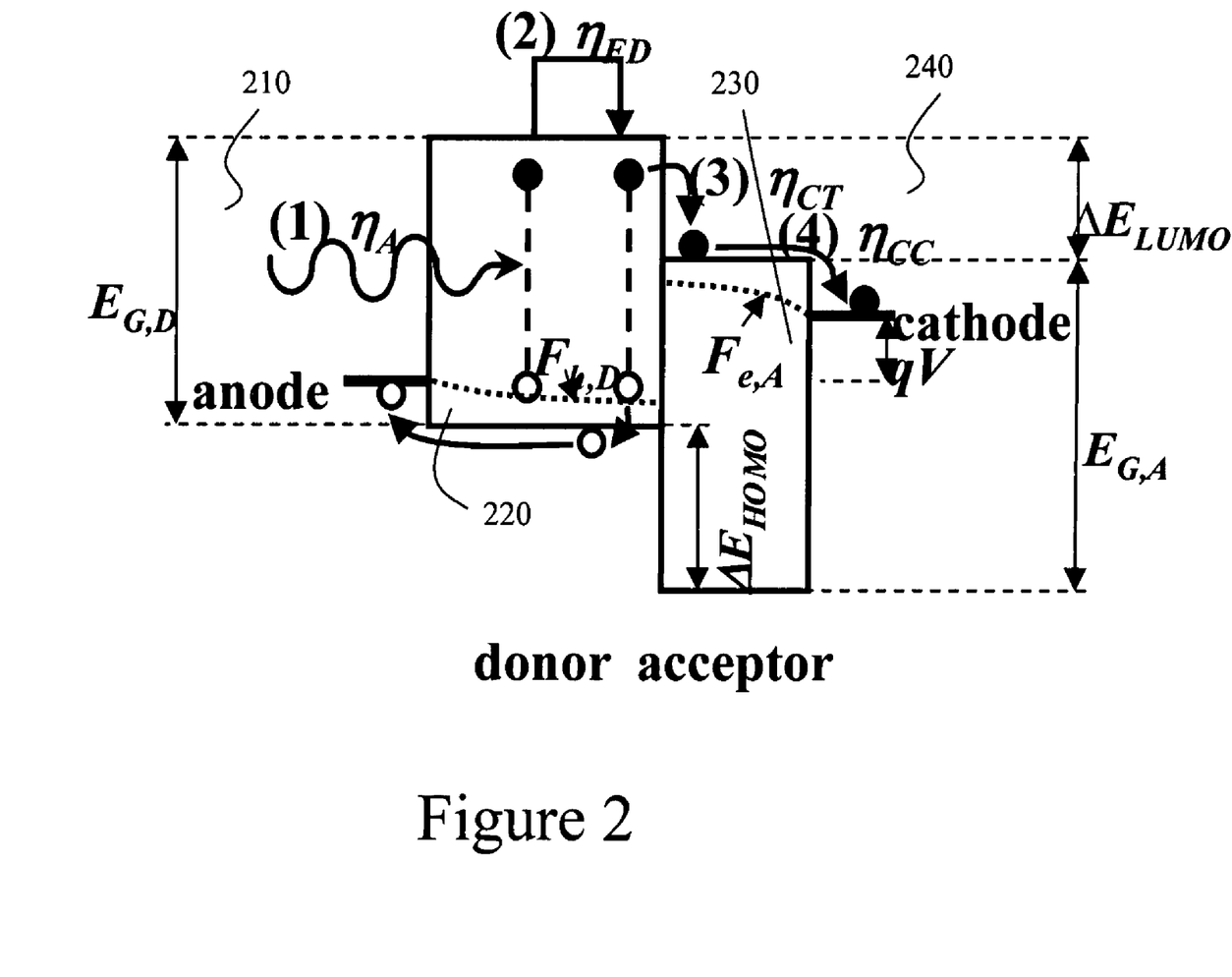
FIG. 2 shows an energy level diagram useful for understanding embodiments of the invention.

The conversion of photons into charge at a DA interface occurs in four sequential steps as shown in FIG. 2. FIG. 2 shows an energy level diagram for an anode 210, a donor layer 220, an acceptor layer 230, and a cathode 240. The transport energy gaps of the donor and acceptor are indicated by the symbols $E_{G,D}$ and $E_{O,A}$, respectively. The HOMO and LUMO band offsets are indicated by $\Delta E_{HOMO}$ and $\Delta E_{LUMO}$, respectively. The hole quasi-Fermi level in the donor, $F_{h,D}$, and electron quasi-Fermi level in the acceptor, $F_{e,A}$, are shown as dotted lines. The difference in quasi-Fermi level from the donor-acceptor interface represents a loss in electrochemical energy due to a resistive losses and recombination. Four consecutive steps in the generation of photocurrent from incident light are illustrated. Photon absorption leading to the generation of an exciton with absorption efficiency, $\eta_A$; (2) diffussion of the exciton to the DA interface with efficiency $\eta_{ED}$; (3) exciton dissociation by CT at a DA interface with efficiency $\eta_{CT}$; and (4) separation of the charge carriers, followed by transport to their respective electrodes with charge collection efficiency, $\eta_{CC}$. The overall quantum efficiency is their product: $\eta_{EQE}=\eta_A\cdot\eta_{ED}\cdot\eta_{CT}\cdot\eta_{CC}$. The photon energy is extracted as the electrochemical energy of the electron-hole pair, given by the difference of the electron quasi-Fermi energies at the acceptor/cathode contact, and hole quasi-Fermi energies at the donor/anode contact. The $\eta_{EQE}$ of an organic DA bi-layer is typically limited by the efficiency of steps (1) and (2), since $\eta_{CT}\cdot\eta_{CC}$ may be 100% or approach 100% (steps (3) and (4)). Note that $\eta_{CC}$ may be about 100% under short circuit conditions. During actual cell operation, solar cells may be under a forward bias and deliver a current against that bias. The maximum cell power that can be extracted may depend on how $\eta_{CC}$ varies with applied voltage. Embodiments of the invention address the issue of how to keep $\eta_{CC}$ high under forward bias.

The high separation probability, $\eta_{CC}$, of the free charges near the DA interface, despite strong mutual Coulomb attraction, is unexplained in the literature. One theory is that the case of a conjugated polymer donor and small molecular weight acceptor, the ground-state energy of a hole on a polymer chain subjected to the potential well due to the proximity of an electron on a nearby acceptor molecule, acts as a repulsive potential that separates the electron and hole. V. Arkhipov, P. Heremans, and H. Bässler, Appl. Phys. Lett. 82, 4605 (2003). This model is restrictive in that it assumes alignment of the polymer chain parallel to the DA interface. In addition, it requires that the hole effective mass along the polymer chain $m_{eff}$<0.1 $m_0$, where $m_0$ is the rest mass of an electron, which is unlikely given the small electronic bandwidths characteristic of this class of materials. H. F. Meng and C. M. Lai, Phys. Rev. B 55, 13611 (1997). E. A. Silinsh, Organic molecular crystals: interaction, localization, and transport phenomena (American Institute of Physics Press, New York, 1994). Finally, it fails to explain the equally high collection efficiencies observed for junctions consisting of small molecular weight materials on both the D and A sides of the interface. L. A. A. Pettersson, L. S. Roman, and O. Inganas, J. Appl. Phys. 86, 487 (1999); P. Peumans, A. Yakimov, and S. R. Forrest, J. Appl. Phys. 93, 3693 (2003).

An embodiment of the invention explains the magnitude and voltage dependence of cc. The analysis is based on the Onsager model for the charge-pair separation probability in the bulk of a disordered solid. L. Onsager, Phys. Rev. 54, 554 (1938). Onsager calculated the probability that two oppositely charged carriers are separated by an external electric field, F, as a function of the initial separation of the carriers, $r_0$, and orientation of the field, assuming that the carrier motion is described by hopping transport (see FIG. 3, photoactive region 310). Refinements to this model, H. Scher and S. Rackovsky, J. Chem. Phys. 81, 1994 (1984); S. Rackovsky and H. Scher, Phys. Rev. Lett. 52, 453 (1984), accurately predict the charge separation probability in the bulk of organic thin films and single crystals as a function of F. E. A. Silinsh, Organic molecular crystals: interaction, localization, and transport phenomena (American Institute of Physics Press, New York, 1994) (hereinafter "Silinsh"). The initial separation $r_0$ that describes experimental photoconductivity data is typically about 10-100 Å and originates from the thermalization of the hot carriers formed after autoionization of the exciton immediately following photoexcitation, see Silinsh. Approximating the electron and hole by point charges, and assuming that the macroscopic dielectric constant of the medium can be used at 10-100 Å length scales, the Coulomb energy of the initial charge pair is $U_B = q^2/4\pi\epsilon_0\epsilon_r r_0$, where q is the electron charge, $\epsilon_0$ is the vacuum permittivity, and $\epsilon_r$ is the dielectric constant of the organic material (typically about 3-4). For $r_0$=20 Å, $U_B$ is about 0.25 eV>>kT such that separation of the geminate pair in the bulk into free carriers occurs when F>$10^6$ V/cm.

Figure 3:
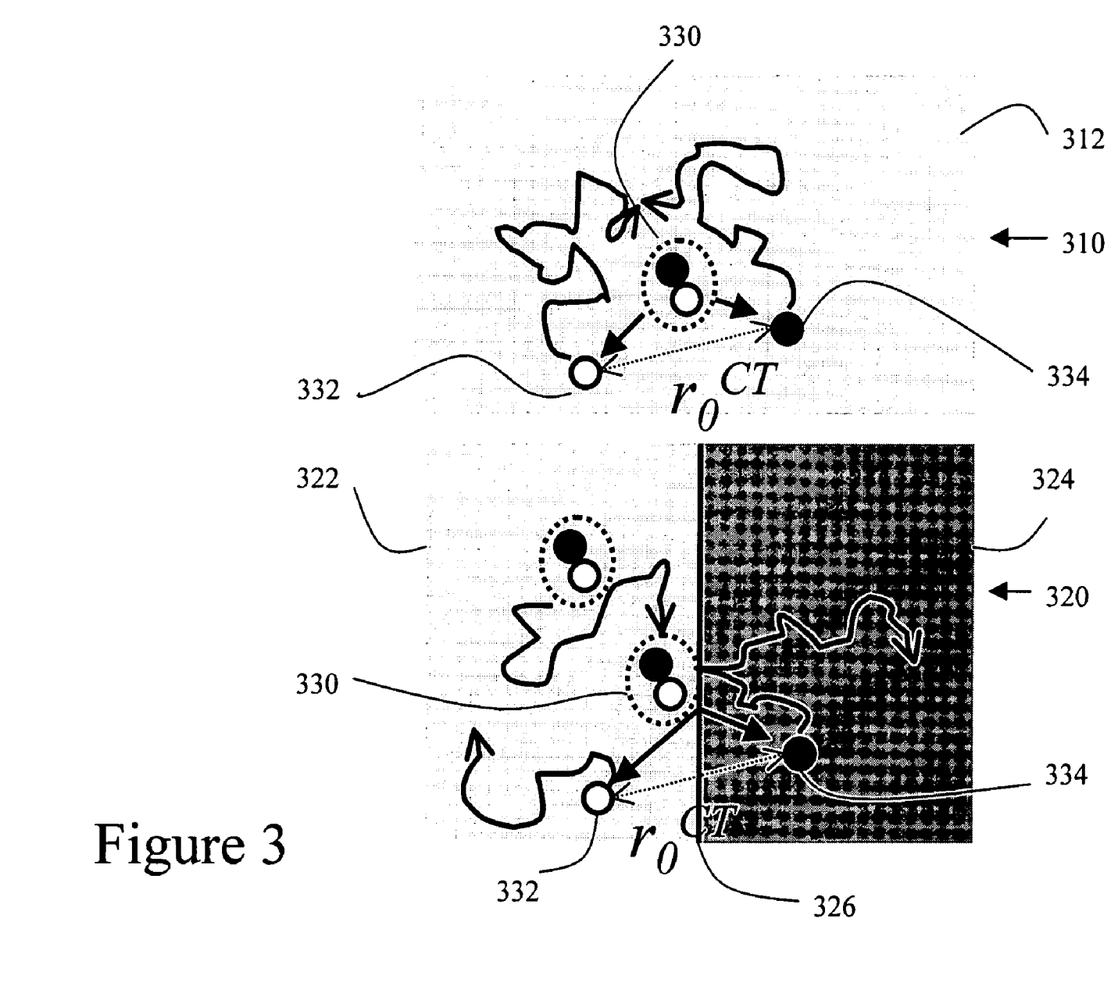
FIG. 3 illustrates geminate pair dissociation in bulk and at a heterojunction.

FIG. 3 illustrates geminate pair dissociation in bulk, as contrasted with geminate pair dissociation in the presence of a DA interface. Photoactive region 310 shows only a single layer 312. A geminate pair 330 dissociates into a hole 332 and an electron 334. $r_0^{CT}$ is the thermalization radii. The dissociation illustrated in photoactive region 310 is representative of that discussed in L. Onsager, Phys. Rev. 54, 554 (1938). Photoactive region 320 shows a donor layer 322 and an acceptor layer 324, forming a DA interface (or junction) 326 where they are in contact with each other. A geminate pair 330 dissociates into a hole 332 and an electron 334.

It is reasonable to assume that the CT process at a DA interface is analogous to bulk autoionization processes, see Silinsh. Then the excess energy, $E^* = \Delta E_{LUMO} - E_{B,D}$ for an exciton in the donor, and $E^* = \Delta E_{HOMO} - E_{B,A}$ in the acceptor, is converted into kinetic energy of the electron and hole upon CT. The hot carriers rapidly thermalize to the lattice temperature by inelastic scattering, resulting in a geminate charge pair spanning the DA interface with an initial radius $r_0^{CT}$ as illustrated in FIG. 3, photoactive region 320. The boundary conditions of the system illustrated in photoactive region 320 are different from those assumed in L. Onsager, Phys. Rev. 54, 554 (1938), because in photoactive region 320 the electron and the hole are each confined to a half-space by the energy level offset at the DA junction (see FIG. 2).

The probability for geminate charge separation at a DA interface is expected to be substantially enhanced over the bulk case because (1) the volume available for electron-hole recombination is reduced to a thin section near the DA interface; (2) the DA interface orients the electron-hole pair, favoring carrier separation in the direction normal to the interface plane; and (3) if the mobility of the hole (electron) is significantly higher than that of the electron (hole), the hole (electron) will sample a much larger volume of space prior to the electron (hole) reaching the DA interface. This increases the probability that the hole (electron) will escape during that time and avoid recombination with the electron (hole) from which it separated. The relevant mobilities are of electrons in the acceptor portion of a photoactive region, and of holes in the donor portion of a photoactive region.

$\eta_{CC}$ may be evaluated using a kinetic Monte Carlo simulation. An example of such a simulation may be found at D. P. Landau and K. Binder, Guide to Monte Carlo simulations in statistical physics (Cambridge University Press, Cambridge, UK, 2000). A simulation may be performed on a simple cubic lattice with lattice constant d. An electron and a hole are generated in the lattice, separated by a distance $r_0^{CT}$, such that the distance of both the electron and hole from the DA interface is $r_0^{CT}/2 = r_{0,e} = r_{0,h}$. The energy of the system corresponding to a configuration of the electron at $r_e$ and hole at $r_h$ is:

$$U = \frac{q^2}{4\pi\epsilon\epsilon_0 |r_{eh}|} - qF \cdot r_{eh} + U_{LUMO}(r_e) + U_{HOMO}(r_h) \quad (1)$$

Figure 4:
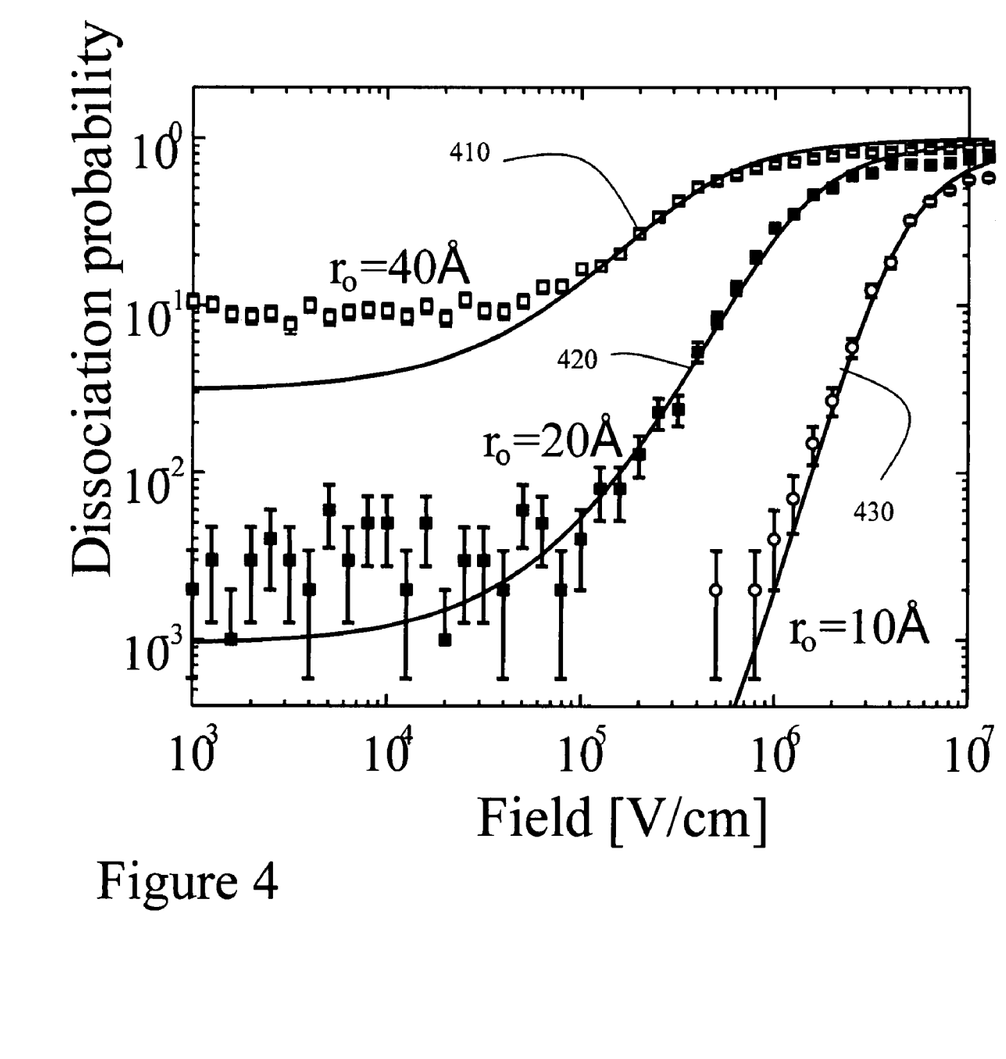
FIG. 4 shows analytical and modeled plots of dissociation probability v. field (V/cm) for various thermalization radii.

Here, $r_{eh} = r_e - r_h$, and $U_{LUMO}(r)$ and $U_{HOMO}(r)$ are the LUMO and HOMO energy levels, respectively, as functions of position, r. The second term is the energy of the dipole in the electric field present at the DNA interface, F. The electron (I=1 . . . 6) or hole (i=7 . . . 12) hopping rates, Ri, are then calculated for hopping onto the six nearest neighbors:

$$R_i = \begin{cases} v_0 \exp(-\Delta U/kT) & \Delta U \geq 0 \\ v_0 & \Delta U < 0 \end{cases} \quad (2)$$

where the attempt frequency, $v_0$, is proportional to the carrier mobility. Hops that would lead to both carriers occupying the same lattice site follow the rate constant for carrier recombination, $R_i = \tau_R^{-1}$. The number of charge separation events, S, is recorded for a large number of trials, $N_{trial}$, as a function of the model parameters. The charge separation probability is then $\eta_{CC} = S/N_{trial}$. The standard deviation is $\sigma(\eta_{CC}) = \text{sqrt}(S)/N_{trial}$. As shown in FIG. 4, in the absence of a DA interface, the discrete model approximates the analytical expression for $_{CC}$ found in L. Onsager, Phys. Rev. 54, 554 (1938), for various thermalization radii, $r_0$.

FIG. 4 shows a comparison between the analytical expression for the probability of exciton dissociation from L. Onsager, Phys. Rev. 54, 554 (1938) (lines), and the kinetic Monte Carlo model discussed herein (symbols) for various electron and hole thermalization radii, $r_0$. The discrete model assumes: d=1 Å, $v_{0,h} = v_{0,e} = \tau_R^{-1}$, T=300K, $\epsilon$=4, and $N_{trial}$=1000. Here, d was chosen to be much smaller than the molecular spacing to make the discrete model consistent with the analytical theory for point charges. The deviations between the analytic expression and the kMC model for $r_0$=40 Å at low fields (F<$10^5$ V/cm) are due to finite computational domain effects: the electron and hole sample a space that is larger than the calculation domain during the simulation. The deviations at large fields (F>$10^6$V/cm) for all exciton radii are due to finite particle size. Plots 410, 420 and 430 show dissociation probablity v. field for thermalization radii $r_0$ of 40 Å, 20 Å, and 10 Å, respectively.

Figure 5:
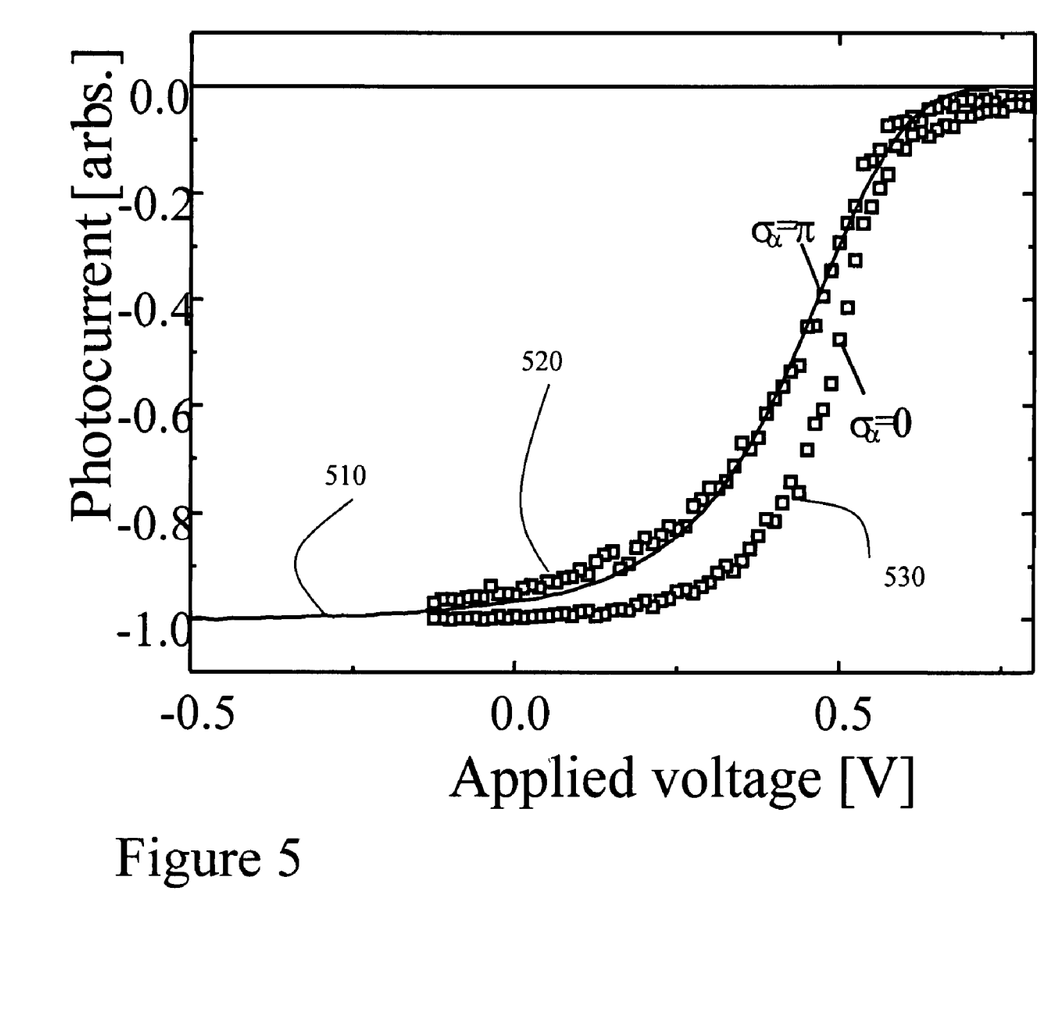
FIG. 5 shows plots of $\eta_{CC}$ vs. the voltage V applied to a PV cell, based on the modeling described herein.
Figure 6:
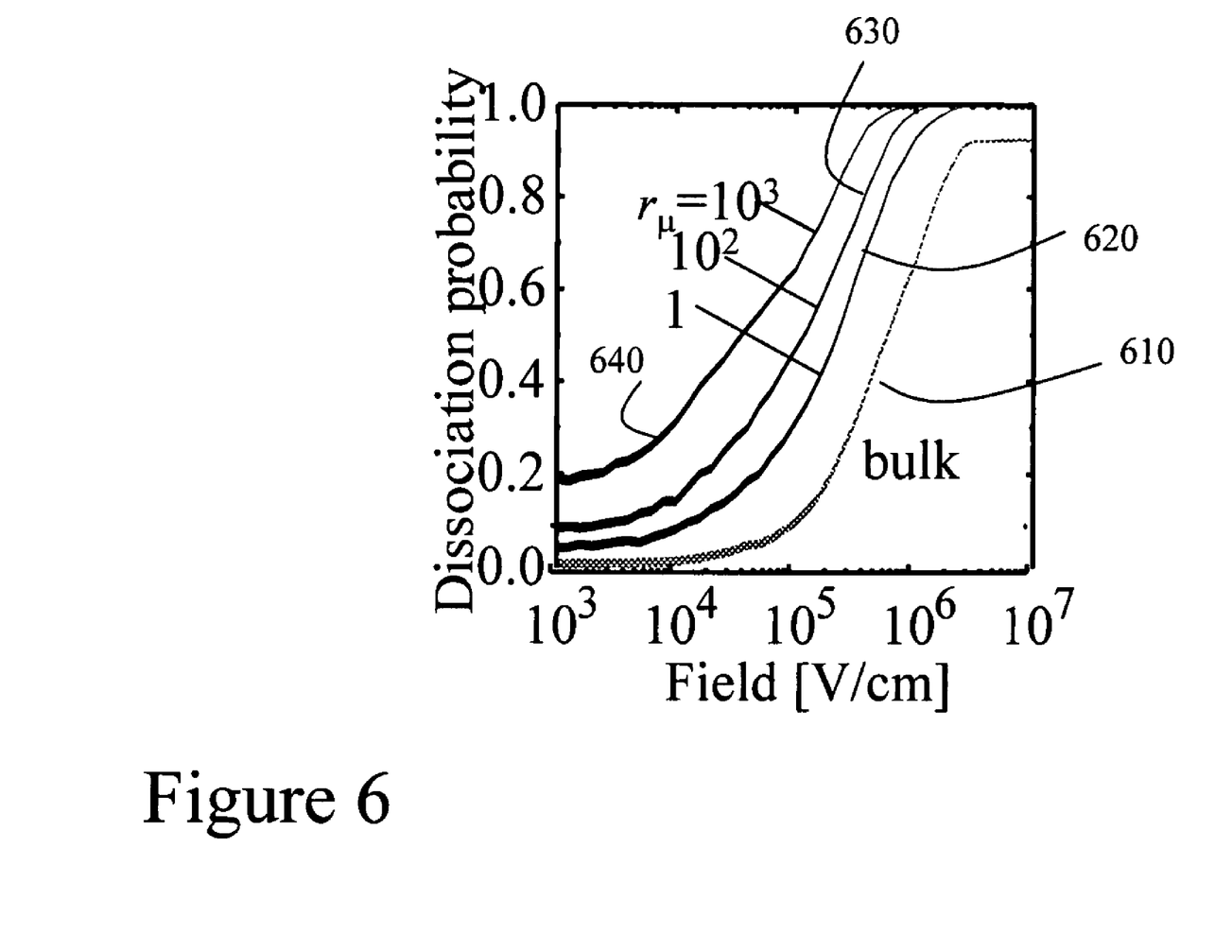
FIG. 6 shows calculated results for charge separation probability, $\eta_{CC}$, in the presence and absence of a donor-acceptor junction, and for various charge carrier mobility ratios in the presence of a DA junction.

In an embodiment of the invention, a DA bilayer may be considered, with the transport energy gap of both the donor and acceptor material chosen to be identical $E_{G,D} = E_{G,A} = E_G$. In this case, the LUMO and HOMO offset energies are $\Delta E_{LUMO} = \Delta E_{HOMO} = \Delta E$. The excess energy of an exciton upon reaching the DA interface is $E^* = \Delta E - E_B$. The dissociation probability of CT pairs at a DA junction at low fields is substantially higher than the probability in the bulk, as shown in FIG. 6. For the bulk case, it is assumed that orientation of the initial dipole with respect to the applied field is random ($\sigma_\alpha=2\pi$), while for the case with a DA junction, the orientation of the initial dipoles is assumed to be a half range isotropic distribution ($\sigma_\alpha=\pi$). For the DA junction case, the dissociation probability is shown as a function of the mobility mismatch, $r_\mu=\max(v_{0,e}/v_{0,h}, v_{0,h}/v_{0,e})=1,100$ and $1,000$, where $v_{0,e}$ and $v_{0,h}$ are the electron and hole attempt frequencies (which are proportional to the carrier mobilities), respectively. FIG. 5 illustrates a somewhat counterintuitive finding, that the efficiency of a PV device may be enhanced by lowering the mobility of a particular charge carrier, because the ratio of mobilities is important to the dissociation probability. Preferably, the ratio of mobilities is at least 100, and more preferable at least 1000. Since having a high carrier mobility is also preferable, the high ratio of mobilities is preferably combined with a high carrier mobility for the most mobile charge carrier in the relevant portion of the photoactive region. Preferably, the charge carrier having the highest mobility (holes in the donor or electrons in the acceptor) has a mobility of at least 0.001 cm$^2$/V-sec, and more preferably of at least 1 cm$^2$/V-sec. One of skill in the art can readily select appropriate donor/acceptor material combinations to practice this embodiment of the invention, based on carrier mobility values. For example, the mobility of a lower mobility material may be decreased by adjusting deposition conditions to obtain more amorphous films (for example, by using a faster deposition rate and lower substrate temperature during deposition), or by adding steric groups to the molecule (for example, by using copper-octabutoxy-phthalocynanine instead of copper phthalocyanine).

To apply the exciton dissociation model to a PV cell, the internal field distribution near the DA junction is computed. The donor and acceptor layers are assumed to be p and n-type doped, respectively, since this combination will result in a built-in field that separates the electrons and holes under short-circuit conditions. Capacitance-voltage measurements on the archetype copper phthalocyanine (CuPc)/3,4,9,10-perylene tetracarboxylic bisbenzimazole (PTCBI) system have shown that this is indeed the case, see P. Peumans, A. Yakimov, and S. R. Forrest, J. Appl. Phys. 93, 3693 (2003). The free carrier densities in the donor and acceptor layers are $N_D$ and $N_A$, respectively. The position of the Fermi level with respect to the HOMO in the donor material is then $E_{f,D}=kT \ln(N_{HOMO}/N_D)$, with an analogous expression for the Fermi level in the acceptor material, $E_{f,A}$. Here, $N_{LUMO}$ and $N_{HOMO}$ are the acceptor LUMO and donor HOMO effective densities of states, respectively. Hence, the built-voltage of the DA junction is:

$$V_{bi}=(E_G-\Delta E-E_{f,D}-E_{f,A})/q. \quad (3)$$

To validate the model, $N_D=N_A=1\times 10^{18}$ cm$^{-3}$, $E_G=1.7$ eV and $\Delta E=0.9$ eV may be used, in agreement with measurements on the CuPc/PTCBI system, see P. Peumans, A. Yakimov, and S. R. Forrest, J. Appl. Phys. 93, 3693 (2003). Furthermore, it may be assumed that $N_{HOMO}=N_{LUMO}=10^{21}$ cm$^{-3}$, approximately corresponding to the molecular number density. This results in $V_{bi}=0.44V$, in agreement with measurements of $V_{OC}$ of CuPC/PTCBI bi-layer cells.

FIG. 5 shows plots of $\eta_{CC}$ vs. the voltage V applied to a PV cell, based on the modeling described herein. Since $V_{bi}=0.5V$, then V=0.5V corresponds to F→0. The model produces photocurrent characteristics in close agreement with measurements on CuPc/C$_{60}$ bi-layer PV cells, assuming that $\sigma_\alpha=\pi$. The solid line 510 shows the photocurrent characteristics of a PEDOT:PSS/200 CuPc/200 C60/150 BCP/800 Al device, per P. Peumans and S. R. Forrest, Appl. Phys. Lett. 79, 126 (2001). The symbols 520 and 530 show results from the simulation described herein, for $\sigma_\alpha=\pi$ (symbols 520) and $\sigma_\alpha=0$ (symbols 530). The parameters for the discrete model are: $r_{0,h}^{CT}=r_{0,e}^{CT}=24$ Å, d=$r_0$=8 Å, $v_{0,h}$=15 $v_{0,e}$=100 $\tau_R^{-1}$ T=300K, $\in$=4, $N_{trail}$=10,000. The model was run for an isotropic half range distribution of initial dipoles ($\sigma_\alpha=\pi$) and for initial dipoles aligned perpendicular to the donor-acceptor (DA) interface ($\sigma_\alpha=0$). To convert electric field at the donor-acceptor interface, F, into the applied voltage V, the expression V=$V_{bi}$−FW was used. The depletion layer width W is approximately constant for 0<V<$V_{bi}$ since the DA interface is compensated in the case of a CuPc/PTCBI junction, see P. Peumans, V. Bulovic, and S. R. Forrest, Appl. Phys. Lett. 76, 3855 (2000). The built-in voltage is $V_{bi}$=0.5V and W=125 Å. Prior to this analysis, a linear function $I_{ph}^{bulk}=I_{ph}^0(V-V_{bi})$, corresponding to bulk exciton dissociation was subtracted from the photocurrent characteristics to obtain the photocurrent originating at the DA junction (solid line). $I_{ph}^0$ was determined by fitting a linear curve to the photocurrent for

V<−0.4V.

FIG. 6 shows calculated results for charge separation probability, $\eta_{CC}$, in the presence and absence of a donor-acceptor junction, and for various charge carrier mobility ratios in the presence of a DA junction. The parameters for the discrete model are: $r_{0,h}^{CT}=r_{0,e}^{CT}=16$ Å, d=$r_0$=8 Å, $v_{0,h}=r_\mu v_{0,e}, v_{0,e}=10\tau_R^{-1}$, T=300K, $\in$=4, and $N_{trial}$=10,000. The bulk case assumes an isotropic initial dipole distribution, while for the DA junction, the orientation of the initial dipoles was assumed to be a half range isotropic distribution. The ratio of electron to hole mobilities was varied from $r_\mu$=1, 100, and 1000. The thickness of the lines indicate the standard deviation.

The model correctly predicts the reduced photoresponse as V→$V_{bi}$. This behavior is in contrast to conventional semiconductor p-n junctions, where the response remains constant at forward voltages considerably exceeding $V_{bi}$, and may represent a fundamental limitation to the ultimate power efficiencies attainable employing organic DA junctions.

Figure 7:
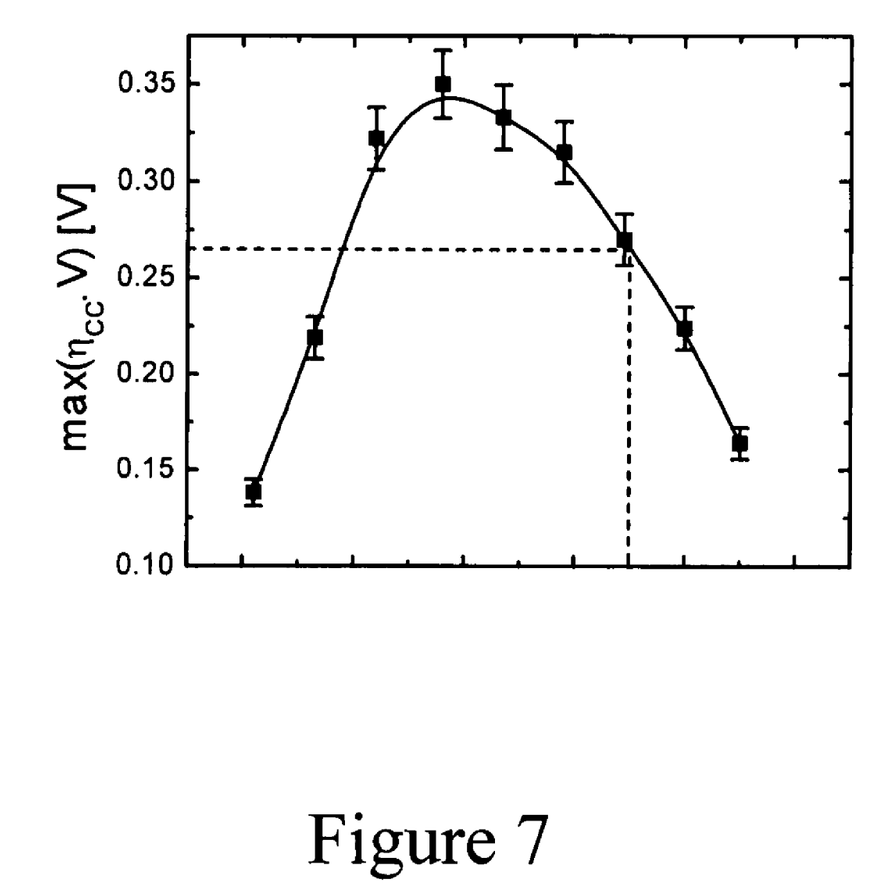
FIG. 7 shows the maximum of the product $\eta_{CC}V$ (proportional to total PV cell efficiency) vs HOMO or LUMO energy offset ΔE.
Figure 8:
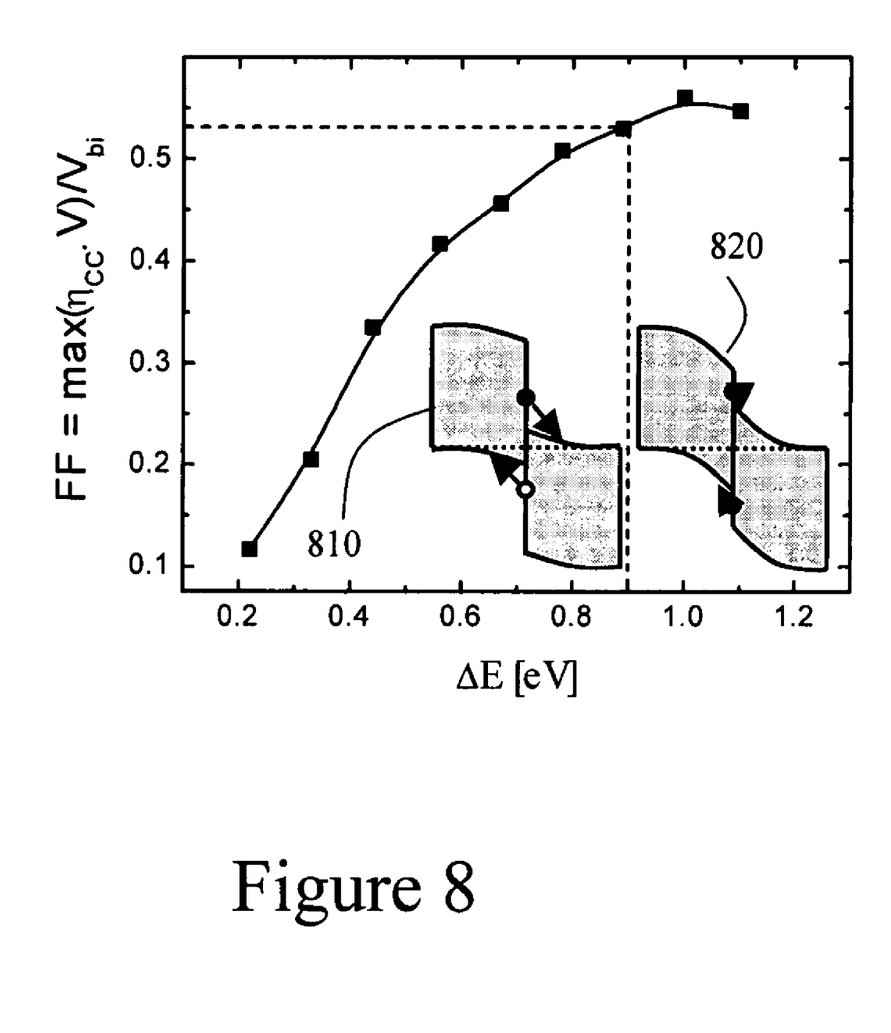
FIG. 8 shows FF plotted as a function of ΔE.

The thermalization distance, $r_0^{CT}$, over which carrier cooling occurs depends on the amount of excess kinetic energy resulting from the HOMO and LUMO offsets, $\Delta E$, as shown schematically in FIGS. 7 and 8. A material combination with a large energy level offset results in a smaller $V_{bi}$ according to Eq. (3), but larger $r_0^{CT}$ due to a larger excess kinetic energy of the exciton. We therefore expect that for a DA combination with a large $\Delta E$, $V_{OC}$ is low, but $\eta_{CC}$ rises steeply to a large value as a function of the extraction voltage $V_{bi}$−V due to the large $r_0^{CT}$. On the other hand, a DA combination with a small $\Delta E$ has a large $V_{OC}$, but $\eta_{CC}$ is now less strongly voltage dependent due to a smaller $r_0^{CT}$.

Following these considerations, FIG. 7 shows the maximum of the product $\eta_{CC}V$ (proportional to total PV cell efficiency) vs HOMO or LUMO energy offset $\Delta E$. The parameters user are: d=$r_0$=8, $v_{0,h}$=10 $v_{0,e}$=10$\tau_R^{-1}$, T=300K, $\in$=4, and $N_{trial}$=1000. The built-in voltage is $V_{bi}$=1.7 eV−($\Delta E$−0.3 eV)/q. It was assumed that $r_{0,h}=r_{0,e}=36$ ÅeV$^{-1}$($\Delta E-E_B$). The plotted quantity is proportional to the power conversion efficiency, $\eta p=\max\{\eta_{CC}V\} S(\lambda)\eta_A\eta_{ED}d\lambda/P_{inc}$, where $S(\lambda)$ is the solar photon spectral density and $P_{inc}=S(\lambda)hc/\lambda d\lambda$ is the incident optical power density. An optimal $\eta_{CC}V$ is reached for $\Delta E\approx 0.55$ eV, or more generally for $\Delta E=0.5$ to 0.65 eV.

The fill-factor (FF) of an organic PV cell is equal to:

$$FF = \frac{\max\{\eta_{CC}V\}}{\eta_{CC}(V=0)V_{bi}} \quad (4)$$

assuming that the open circuit voltage $V_{OC}$ is about equal to $V_{bi}$. FIG. 8 shows FF plotted as a function of $\Delta E$, where FF increases for larger energy offsets. The optimization of organic PV cells may involve a trade-off between a high FF and a high $V_{OC}$ with an optimum for $\Delta E$=0.55 eV, or more generally 0.5 to 0.65 eV. The calculated FF=0.55 is in agreement with experimental observations for systems where $\Delta E$=0.9 eV, see P. Peumans, V. Bulovic, and S. R. Forrest, Appl. Phys. Lett. 76, 2650 (2000). Actual measured values of FF may sometimes be slightly higher than the values predicted by the modeling herein as a consequence of the forward dark current which causes $V_{OC}<V_{bi}$, thereby increasing FF. This effect may not affect the power conversion efficiency since the product $V_{OC}$FF may remain constant.

FIG. 8 also shows a schematic diagram of a DA junction 810 with a large $\Delta E$ and $r_0^{CT}$, and low $V_{bi}$, and a DA junction 820 with a small $\Delta E$ and $r_0^{CT}$, and large $V_{bi}$.

In fine grained bulk heterojunction (BH) organic PV cells, see J. J. M. Halls, C. A. Walsh, N. C. Greenham, E. A. Marseglia, R. H. Friend, S. C. Moratti, and A. B. Holmes, Nature 376, 498 (1995); G. Yu, J. Gao, J. Hummelen, F. Wudi, and A. J. Heeger, Science 270, 1789 (1995), where the domain size is smaller than the depletion layer width, the built-in potential drop may occur over the whole device thickness rather than being concentrated near a flat junction resulting in a reduced driving force for separation. Furthermore, the field F is not necessarily aligned perpendicular to the DA junction, and narrow constrictions in the D and A branches enhance back-diffusion, leading to decreased dissociation probabilities. It is therefore expected that the photocurrent-voltage characteristics of BH devices will be less steep, resulting in a lower FF and $\eta_{CC}<1$ at short-circuit conditions, in agreement with experimental observations, see J. J. M. Halls, C. A. Walsh, N. C. Greenham, E. A. Marseglia, R. H. Friend, S. C. Moratti, and A. B. Holmes, Nature 376, 498 (1995); G. Yu, J. Gao, J. Hummelen, F. Wudi, and A. J. Heeger, Science 270, 1789 (1995).

Although the present invention is described with respect to particular examples and preferred embodiments, it is understood that the present invention is not limited to these examples and embodiments. The present invention as claimed may therefore include variations from the particular examples and preferred embodiments described herein, as will be apparent to one of skill in the art.

The invention claimed is:

1. A photoactive device for generating an electrical current by converting electromagnetic radiation into electricity, comprising:
   a first electrode;
   a second electrode;
   a photoactive region disposed between and electrically connected to the first electrode and the second electrode, the photoactive region further comprising:
   an organic donor layer;
   an organic acceptor layer, disposed such that the organic donor layer and the organic acceptor layer form a donor-acceptor heterojunction that forms excitons by absorption of photons in the organic photoactive region, wherein said electrical current is generated when said excitons dissociate at the donor-acceptor heterojunction;
   wherein the mobility of holes in the organic donor layer is greater than the mobility of electrons in the organic acceptor layer by a factor of at least 100, and
   the mobility of holes in the organic donor layer is greater than 0.001 cm²/V-sec.

2. The device of claim 1, wherein the mobility of holes in the organic donor layer is greater than the mobility of electrons in the organic acceptor layer by a factor of at least 1000.

3. The device of claim 1, wherein the mobility of holes in the organic donor layer is greater than 1 cm²/V-sec.

4. The device of claim 1, wherein the donor-acceptor heterojunction is a planar heterojunction.

5. The device of claim 1, wherein the donor-acceptor heterojunction is a bulk heterojunction.

6. The device of claim 1, wherein the donor-acceptor heterojunctionis a mixed heterojunction.

7. The device of claim 1, wherein the donor-acceptor heterojunction is a hybrid planar-mixed heterojunction.

8. The device of claim 1, wherein the HOMO of the donor layer is greater than the HOMO of the acceptor layer by 0.5 to 0.65 eV, and the LUMO of the donor layer is greater than the LUMO of the acceptor layer by 0.5 to 0.65 eV.

9. The device of claim 1, wherein each of the organic layers has a thickness and a characteristic exciton diffusion length and the characteristic exciton diffusion length is not less than the thickness of the organic layer.

* * * * *